(12) United States Patent
Van Overbeek et al.

(10) Patent No.: US 12,156,500 B2
(45) Date of Patent: Dec. 3, 2024

(54) DISPERSION COMPRISING EU2+ DOPED INORGANIC LUMINESCENT NANOPARTICLES FOR GREENHOUSE APPLICATIONS AND SHEET STRUCTURES AND COATINGS FOR GREENHOUSES COMPRISING SUCH NANOPARTICLES

(71) Applicant: PHYSEE GROUP B.V., Delft (NL)

(72) Inventors: Sadiq Van Overbeek, Delft (NL); Chung-che Kao, Delft (NL); Chao-chun Hsu, Delft (NL); Sicco Henricus Godefridus Peeters, Delft (NL); Ana Jung, Delft (NL)

(73) Assignee: PHYSEE GROUP B.V., Delft (NL)

( * ) Notice: Subject to any disclaimer, the term of this patent is extended or adjusted under 35 U.S.C. 154(b) by 0 days.

(21) Appl. No.: 17/626,269

(22) PCT Filed: Jul. 13, 2020

(86) PCT No.: PCT/EP2020/069807
§ 371 (c)(1),
(2) Date: Jan. 11, 2022

(87) PCT Pub. No.: WO2021/009145
PCT Pub. Date: Jan. 21, 2021

(65) Prior Publication Data
US 2022/0275219 A1    Sep. 1, 2022

(30) Foreign Application Priority Data

Jul. 12, 2019 (NL) .................................. 2023498

(51) Int. Cl.
*C09K 11/77* (2006.01)
*A01G 9/14* (2006.01)
(Continued)

(52) U.S. Cl.
CPC ............... *A01G 9/14* (2013.01); *B32B 17/00* (2013.01); *C03C 17/00* (2013.01); *C03C 17/007* (2013.01);
(Continued)

(58) Field of Classification Search
CPC .................... C09K 11/77347; C09K 11/77348
See application file for complete search history.

(56) References Cited

U.S. PATENT DOCUMENTS

| | | |
|---|---|---|
| 7,536,834 B2 | 5/2009 | Blanc et al. |
| 8,314,546 B2 | 11/2012 | Tchakarov |

(Continued)

FOREIGN PATENT DOCUMENTS

| | | |
|---|---|---|
| CN | 101629077 A | 1/2010 |
| CN | 101787272 A | 7/2010 |

(Continued)

OTHER PUBLICATIONS

First Office Action for Chinese application No. 2020800632255; dated Mar. 9, 2023 (11 pages).

(Continued)

*Primary Examiner* — Matthew E. Hoban
(74) *Attorney, Agent, or Firm* — Mendelsohn Dunleavy P.C.

(57) ABSTRACT

A luminescent layer is described comprising an $Eu^{2+}$ doped inorganic luminescent material comprising or consisting essentially of the elements Al and/or Si and the elements O and/or N, the doped inorganic luminescent material converting radiation of the UV region between 200 nm and 400 nm of the solar spectrum into the photosynthetically active radiation (PAR) region (400 nm-700 nm) of the solar spectrum, wherein the Si concentration in the inorganic luminescent material is selected between 0 and 45 at. %, the Al concentration between 0 and 50 at. %, the O concentration (Continued)

between 0 and 70 at. %, the N concentration between 0 and 60 at. % and the Eu2+ between 0.01 and 30 at. %.

16 Claims, 7 Drawing Sheets

(51) Int. Cl.

| | | |
|---|---|---|
| B32B 17/00 | (2006.01) | |
| C03C 17/00 | (2006.01) | |
| C08J 5/18 | (2006.01) | |
| C08K 9/04 | (2006.01) | |
| C09D 5/22 | (2006.01) | |
| C09D 7/20 | (2018.01) | |
| C09D 7/40 | (2018.01) | |
| C09D 7/62 | (2018.01) | |
| C09K 11/00 | (2006.01) | |
| C09K 11/02 | (2006.01) | |
| G02B 1/115 | (2015.01) | |
| G02B 5/02 | (2006.01) | |
| A01G 9/20 | (2006.01) | |

(52) U.S. Cl.
CPC .............. *C03C 17/009* (2013.01); *C08J 5/18* (2013.01); *C08K 9/04* (2013.01); *C09D 5/22* (2013.01); *C09D 7/20* (2018.01); *C09D 7/62* (2018.01); *C09D 7/67* (2018.01); *C09K 11/00* (2013.01); *C09K 11/025* (2013.01); *C09K 11/77347* (2021.01); *C09K 11/77348* (2021.01); *G02B 1/115* (2013.01); *G02B 5/021* (2013.01); *A01G 2009/1484* (2013.01); *A01G 9/20* (2013.01); *C03C 2217/445* (2013.01); *C03C 2217/475* (2013.01); *C03C 2217/48* (2013.01); *C08K 2201/011* (2013.01)

(56) References Cited

U.S. PATENT DOCUMENTS

| | | | |
|---|---|---|---|
| 2005/0001225 A1 | 1/2005 | Yoshimura et al. | |
| 2006/0168905 A1 | 8/2006 | Blanc et al. | |
| 2008/0258602 A1* | 10/2008 | Masuda ................ | H01L 33/507 313/487 |
| 2009/0278448 A1 | 11/2009 | Tchakarov | |
| 2010/0102251 A1* | 4/2010 | Ferrini .................. | H05B 33/22 427/164 |
| 2010/0309647 A1* | 12/2010 | Winkler ................ | H05B 35/00 362/84 |
| 2011/0090683 A1* | 4/2011 | Petry ................... | C09K 11/7774 427/64 |
| 2011/0149550 A1 | 6/2011 | Jermann et al. | |
| 2012/0057337 A1 | 3/2012 | Liebald et al. | |
| 2013/0194669 A1 | 8/2013 | De Waele et al. | |
| 2014/0355106 A1 | 12/2014 | Laluet et al. | |
| 2017/0139109 A1 | 5/2017 | Gierens et al. | |
| 2017/0288080 A1 | 10/2017 | Carter et al. | |
| 2017/0369774 A1* | 12/2017 | He ..................... | C09K 11/7734 |
| 2018/0074251 A1 | 3/2018 | Berard et al. | |

FOREIGN PATENT DOCUMENTS

| | | |
|---|---|---|
| CN | 102061166 A | 5/2011 |
| CN | 102701745 A | 10/2012 |
| CN | 102765942 A | 11/2012 |
| CN | 103998236 A | 8/2014 |
| CN | 105331361 A | 2/2016 |
| CN | 105682451 A | 6/2016 |
| CN | 105917474 A | 8/2016 |
| CN | 106893584 A | 6/2017 |
| EP | 2437315 A2 | 4/2012 |
| EP | 2618041 A1 | 7/2013 |
| JP | 2001-270733 A | 10/2001 |
| JP | 2008-181771 A | 8/2008 |
| JP | 2009-533808 A | 9/2009 |
| JP | 2012-109 A | 1/2012 |
| JP | 2012-199078 A | 10/2012 |
| JP | 2017-523463 A | 8/2017 |
| JP | 2018-518796 A | 7/2018 |
| NL | 1017077 C1 | 7/2002 |
| NL | 2002577 C2 | 8/2010 |
| RU | 2459855 C2 | 8/2012 |
| WO | 2016020337 A1 | 2/2016 |
| WO | 2018169404 A1 | 9/2018 |
| WO | 2019020598 A2 | 1/2019 |

OTHER PUBLICATIONS

First Office Action for corresponding Chinese application No. 2020800632306; dated Jun. 27, 2023 (12 pages).
International Search Report and Written Opinion for corresponding International application No. PCT/EP2020/069807; dated Sep. 23, 2020 (14 pages).
Kurita, M., et al. "Optical Surface Roughness Measurement From Scattered Light Approximated By Two-dimensional Gaussian Function." Transactions on Engineering Sciences, WIT Press, vol. 2 (1993): 1-10.
Barranco, Angel, et al. "Room temperature synthesis of porous SiO2 thin films by plasma enhanced chemical vapor deposition." Journal of Vacuum Science and Technology A, 22.4 (2004): 1275-1284.
Cho, Yujin, et al. "Low-energy Cathodoluminescence for (Oxy)Nitride Phosphors." Journal of Visualized Experiments: JOVE 117.e54249 (2016): 1-11.
Dedoncker, Robin, et al. "Sputter deposition of porous thin films from metal/NaCl powder targets." Applied Physics Letters 115.4 Article 041601 (2019): 1-5.
Kim, Kyeonghun, et al. "Anti-reflection porous SiO2 thin film deposited using reactive high-power impulse magnetron sputtering at high working pressure for use in a-Si:H solar cells." Solar Energy Materials & Solar Cells 130 (2014):582-586.
Lunt, Richard R., et al. "Transparent, near-infrared organic photovoltaic solar cells for window and energy-scavenging applications." Applied Physics Letters 98.113305 (2011): 1-4.
Merkx, Evert, et al. "Functionalizing window coatings with luminescence centers by combinatorial sputtering of scatter-free amorphous SiAlON:Eu2+ thin film composition libraries." Journal of Luminescence 208 (2019): 51-56.
Tian, Zhen, et al. "Daylight luminous environment with prismatic film glazing in deep depth manufacture buildings." Building Simulation 12.1, Tsinghua University Press (2019): 129-140.
International Search Report and Written Opinion for corresponding International application No. PCT/EP2020/069806; dated Sep. 18, 2020 (12 pages).
Notice of Reasons for Refusal for corresponding Japanese application No. 2022-502015; dated Apr. 5, 2024 (16 pages).
Office Action for corresponding Russian application No. 2022101650; dated Dec. 8, 2023 (14 pages).
Office Action for corresponding Russian application No. 2022101650; dated Jun. 24, 2024 (14 pages).
Papulov Yu.G., "The Relationship Between The Properties Of Substances And The Structure Of Molecules: Mathematical Modeling" Successes of Modern Natural Science 2 (2006): 75-76.
Kazankin O.N. et al., "Inorganic luminophores." Leningrad: Chemistry (1975): 7-9.
Notice of Reasons for Rejection for corresponding Japanese application No. 2022-502016; dated Jul. 3, 2024 (17 pages).
Request for Submission of Opinion for corresponding Korean application No. 10-2022-7004391; dated Sep. 5, 2024 (19 pages) Machine Translation.
Request for Submission of Opinion for corresponding Korean application No. 10-2022-7004392; dated Sep. 9, 2024 (20 pages) Machine Translation.

* cited by examiner

DISPERSION COMPRISING EU2+ DOPED INORGANIC LUMINESCENT NANOPARTICLES FOR GREENHOUSE APPLICATIONS AND SHEET STRUCTURES AND COATINGS FOR GREENHOUSES COMPRISING SUCH NANOPARTICLES

FIELD OF THE INVENTION

The invention relates to $Eu^{2+}$ luminescent inorganic nanoparticles for greenhouse applications, and, in particular, though not exclusively, to $Eu^{2+}$ luminescent inorganic nanoparticles for greenhouse coatings, to dispersions comprising $Eu^{2+}$ luminescent inorganic nanoparticles, to transparent sheet structures comprising such particles and glazing structures comprising such nanoparticles coatings and to methods of synthesizing the $Eu^{2+}$ luminescent inorganic nanoparticles.

BACKGROUND OF THE INVENTION

Greenhouses provide a controlled climate environment for efficiently growing plants and crops. To control and optimize solar light entering the greenhouse different types of coatings have been developed, which can be used to coat glazing structures or plastic transparent sheets that are part of the greenhouse. Different pigment coatings with different optical properties, such as photo-selecting, reflective coatings or diffusive coatings, are available to control light entering a greenhouse. Typically, these coatings are spray-coated and can be removed so that, depending on the season and/or the type of plants that are grown, different coatings may be used. An example of such coating is described in WO2018/169404 which describes a removable coating for greenhouses comprising a pigment such as chalk or titanium oxide. Based on such pigment dispersions, during the summer the glazing of a greenhouse may be spray-coated with an infrared radiation reflective coating if the plants are sensitive to high levels of IR radiation. Similarly, a diffusive coating may be used to remove shading effects and to provide a homogeneous exposure of plants in the greenhouse to solar light.

In the prior art it has been suggested to further improve light coupling into the greenhouse based on luminescent materials. Typically, these materials include a transparent plastic sheet comprising luminescent particles. Such materials may be optimized to convert one part (or parts) of the radiation in the electromagnetic spectrum to different wavelengths for a more effective use of the radiation. For example, a luminescent spectral down conversion layer applied as a luminescent coating on glazing structures of greenhouses can enhance crop growth by reducing the spectral mismatch between the solar spectrum and the photosynthetically active radiation (PAR) region (400 nm-700 nm) of crops by converting UV light (100 nm-400 nm) which is often deleterious to crops into light that stimulates plant growth within the PAR region. For various fruiting vegetables in greenhouses an increase in light of 1% in the PAR region would yield an increase in plant production of approx. 1%. Hence, such luminescent materials may have huge economic potential.

An example of a luminescent material for greenhouses is described in US20170288080. This prior art document describes an example of a luminescent coating for a greenhouse comprising a polymeric layer with fluorescent organic pigments, for example Lumogen 305, for absorbing parts of the solar spectrum and using the energy of the absorbed photons to emit photons of wavelengths between 600 and 690 nm. The luminescent coating also absorbs over a large part of the solar spectrum that is required for plant growth and flowering (400 to ~640 nm). Other examples of luminescent materials for greenhouses are described in N L1017077 and NL2002577, which describes plastic foils for greenhouses that include inorganic phosphors, in particular Y2O3-based phosphors, which are capable of converting part of UV or IR to visible light.

Currently however such luminescent materials for large scale greenhouse applications are not available on the market. This is mainly because the luminescent materials have absorption and emission spectra that overlap in the PAR region. More generally, known luminescent phosphors, in particular dyes, for greenhouse applications still have substantial photon losses due to overlap of the excitation and emission spectra, thereby making these materials not suitable for large scale commercial applications. For such applications, the coatings should not only be capable of efficiently converting parts of the UV spectrum in visible light, they also should meet other properties like low toxicity, chemically stable, environmentally friendly, cheap, and suitable for large-scale production. Above-mentioned luminescent particles like Lumogen 305 or the Y2O3-based phosphors do not meet these requirements. Finally the materials should also have advantageous optical properties such as low backscattering/anti-reflection properties in the PAR region.

Hence, from the above it follows that there is a need in the prior art for improved luminescent inorganic particle-based coatings for greenhouses. In particular, there is a need for improved luminescent inorganic particle-based coatings that exhibit broadband UV absorption and luminescent emission over the full PAR region (wherein the absorption and emission spectra are non-overlapping), that are transparent (non-absorbing) in the PAR region and that exhibit a high luminescent quantum efficiency (i.e. the ratio between emitted and absorbed photons). Additionally, there is a need for improved inorganic particle-based coatings for greenhouses that have optical and structural properties, including durability, hardness, colour stability and optical scattering properties, that are suitable for greenhouse applications.

SUMMARY OF THE INVENTION

It is an objective of the invention to reduce or eliminate at least one of the drawbacks known in the prior art. In a first aspect, the invention relates to a dispersion of luminescent nanoparticles for coating a greenhouse glazing structure comprising: an organic or aqueous medium; and, luminescent nanoparticles, wherein the nanoparticles comprise or consisting essentially of $Eu^{2+}$ doped SiAlON, the Si concentration being selected between 0 and 33 at. %, the Al concentration between 0 and 40 at. %, the O concentration between 50 and 66 at. %, the N concentration between 0 and 10 at. % and the $Eu^{2+}$ between 0.0001 and 5 at. %.

In an embodiment, the Si concentration may be selected between 15 and 33 at. %, the Al concentration between 0.001 and 12 at. %, O concentration is selected between 50 and 66 at. %, the N concentration between 0.1 and 5 at. % and the $Eu^{2+}$ concentration between 0.0001 and 3 at. %.

In another embodiment, the Si concentration may be selected between 30 and 33 at. %, the Al concentration between 0.01 and 2 at. %, O concentration is selected between 50 and 66 at. %, the N concentration between 0.1 and 1 at. % and the $Eu^{2+}$ concentration between 0.0005 and 1 at. %.

In an embodiment, the nanoparticles may have an average size between 1 and 1000 nm, preferably between 10 and 800 nm, more preferably between 20 and 600 nm.

In an embodiment, the dispersion may comprise between 1% and 80 wt % nanoparticles, preferably between 5% and 50 wt % nanoparticles, more preferably between 15% and 35 wt % nanoparticles.

In an embodiment, the organic medium may comprise an organic solvent (such as hexane, ethanol, heptane, toluene, chloroform, dichloromethane) comprising between 0.5% and 10 wt % polymer additives.

In an embodiment, the aqueous medium may comprise an alkali aqueous solution, such as ammonium solution or a sodium hydroxide solution, the alkali aqueous solution comprising between 1% and 10 wt % water-borne polymer additives.

In an embodiment, the surface of the nanoparticles may be modified based on one or more types of ligands, such as stearic acid, oleic acid, octanoic acid, oleylamine, octylamine, octanthiol, trioctylphosphine, preferably the modification including sonication of the nanoparticles.

In an embodiment, the surface of the nanoparticles may be modified by chemical bonds formation, such as silanization or esterification, to couple nanoparticles to one or more long organic side chains with carbon chain length between 8 and 18;

In an embodiment, the dispersion may further comprise inorganic porous nanoparticles, preferably porous silicon oxide nanoparticles.

In a further aspect, the invention may relate to a transparent plastic sheet for a greenhouse comprising: a transparent polymeric material; and $Eu^{2+}$ doped inorganic luminescent nanoparticles dispersed in the polymeric material, wherein the nanoparticles comprise or consisting essentially of $Eu^{2+}$ doped SiAlON, the Si concentration being selected between 0 and 33 at. %, the Al concentration between 0 and 40 at. %, the O concentration between 50 and 66 at. %, the N concentration between 0 and 10 at. % and the $Eu^{2+}$ between 0.0001 and 5 at. %.

In an embodiment, the Si concentration may be selected between 15 and 33 at. %, the Al concentration between 0.001 and 12 at. %, O concentration is selected between 50 and 66 at. %, the N concentration between 0.1 and 5 at. % and the $Eu^{2+}$ concentration between 0.0001 and 3 at. %.

In an embodiment, the Si concentration is selected between 30 and 33 at. %, the Al concentration between 0.01 and 2 at. %, O concentration is selected between 50 and 66 at. %, the N concentration between 0.1 and 1 at. % and the $Eu^{2+}$ concentration between 0.0005 and 1 at. %

In a further aspect, the thickness of the sheet may be selected between 1 and 1000 micrometer, preferably 10 and 500 mm, more preferably 40 and 120 micrometer.

In a further aspect, the invention may relate to a luminescent glazing structure for a greenhouse comprising: a glazing structure; and, a coating provided over at least part of a surface of the glazing structure, the coating comprising a transparent polymeric material and $Eu^{2+}$ doped inorganic luminescent nanoparticles dispersed in the polymeric material, wherein the nanoparticles comprise or consisting essentially of $Eu^{2+}$ doped SiAlON, the Si concentration being selected between 0 and 33 at. %, the Al concentration between 0 and 40 at. %, the O concentration between 50 and 66 at. %, the N concentration between 0 and 10 at. %, the $Eu^{2+}$ between 0.0001 and 5 at. %. or, preferably, wherein the Si concentration is selected between 15 and 33 at. %, the Al concentration between 0.001 and 12 at. %, O concentration is selected between 50 and 66 at. %, the N concentration between 0.1 and 5 at. % and the $Eu^{2+}$ concentration between 0.0001 and 3 at. %; or more preferably, wherein the Si concentration is selected between 30 and 33 at. %, the Al concentration between 0.01 and 2 at. %, O concentration is selected between 50 and 66 at. %, the N concentration between 0.1 and 1 at. % and the $Eu^{2+}$ concentration between 0.0005 and 1 at. %

In an embodiment, the thickness of the coating may be selected between 10 and 200 micrometer, preferably between 20 and 180 micrometer, more preferably between 50 and 150 micrometer.

In a first aspect, the invention may relate to $Eu^{2+}$ doped inorganic luminescent materials, in particular $Eu^{2+}$ luminescent nanoparticle and microparticle coatings for greenhouses and glazing structures and transparent sheet structures for greenhouses comprising such nanoparticle coatings. The luminescent particles may comprise or consist essentially of the elements Al and/or Si and the elements O and/or N. These luminescent particles are optimized for converting solar radiation of the UV region of the spectrum between 200 nm and 400 nm into radiation of the photosynthetically active radiation (PAR) region between 400 nm and 700 nm. In an embodiment, the nanoparticles comprise or consisting essentially of $Eu^{2+}$ doped SiAlON, the Si concentration being selected between 0 and 33 at. %, the Al concentration between 0 and 40 at. %, the O concentration between 50 and 66 at. %, the N concentration between 0 and 10 at. % and the $Eu^{2+}$ between 0.0001 and 5 at. %.

For reasons of brevity, in this disclosure the references to $Eu^{2+}$ doped SiAlON (SiAlON:$Eu^{2+}$) nanoparticle and microparticle materials include $Eu^{2+}$ doped SiAlON as well as $Eu^{2+}$ doped SiAlO, $Eu^{2+}$ doped SiAlN, $Eu^{2+}$ doped SiON, $Eu^{2+}$ doped AlON, $Eu^{2+}$ doped $SiO_2$, etc. Thus, the SiAlON materials may include any SiAlON stoichiometry which can be described as a linear combination of the neutral units $SiO_2$, $Al_2O_3$, AlN and $Si_3N_4$, i.e. $a*SiO_2+b*Al_2O_3+c*AlN+d*Si_3N_4$, wherein a, b, c and d can take on all values (including zero and non-integer numbers) independent of each other.

The $Eu^{2+}$ doped SiAlON particles may be used in luminescent down-conversion coatings for greenhouse glazing structures and plastic sheets. Additionally, the $Eu^{2+}$ doped SiAlON particles may be dispersed in plastic transparent sheet structures to form a particle-dispersed sheet material. Further, the $Eu^{2+}$ doped SiAlON particles have advantageous luminescent properties, including broadband UV absorption, luminescent emission within the PAR region, transparent (non-absorbing) for photons in the PAR region, non-overlapping absorption and emission spectra and a high luminescent quantum efficiency (LQE), i.e. the ratio between emitted and absorbed photons. Additionally, the particles have optical, structural, and mechanical properties that are compatible with the greenhouse glazing structures. For example, in an embodiment, a luminescent nanoparticle coating may have scatter-free, or at least have low-scattering properties. In another embodiment, a luminescent micron-sized particle coating that has light diffusive properties.

The luminescent conversion materials are particular suitable for $Eu^{2+}$ doped SiAlON nanoparticles for optical structures, such as glazing structures and sheet structures for greenhouses.

The optical properties of $Eu^{2+}$ doped SiAlON nanoparticles have an ideal set of characteristics for luminescent coatings for glazing structures and plastic sheet structures for greenhouses. The luminescent SiAlON:$Eu^{2+}$ nanoparticles have strong absorption in the UV region and emission within the PAR region and no or at least almost no overlap with the absorption region, while the luminescent quantum efficiency (LQE) is close to unity. Additionally, the nanoparticles have superior properties in terms of durability, including e.g. chemical stability, thermal stability, hardness and color stability.

In an embodiment, the $Eu^{2+}$ luminescent nanoparticles substantially consist of the elements Al and/or Si and the elements O and/or N, wherein the term substantially consist of means that the materials may only comprise traces of other elements in the amount of 0.1% or less. In a further embodiment, the $Eu^{2+}$ luminescent materials consist of the elements Al and/or Si and the elements O and/or N or consists of the elements Al, Si, O, N.

The luminescent $SiAlON:Eu^{2+}$ nanoparticles provides a wide tuning range of luminescence across the visible spectrum by varying the ratio between Si and Al and/or the ratio between O and N. In a further embodiment, luminescence may also be tuned based on the concentration of $Eu^{2+}$. As a result, a wide range of compositions of luminescent $SiAlON:Eu^{2+}$ materials exist, where the composition corresponds to emissions ranging from blue to red (400 nm to 700 nm), making these luminescent materials ideal to tailor the emission wavelength to the needs of the greenhouse farmer.

Si-rich compositions in this range will results in luminescent $SiAlON:Eu^{2+}$ nanoparticles absorbing photons in the UV range between 200 and 400 nm and emitting photons in the PAR region, with a high IQE.

The above-mentioned luminescent $SiAlON:Eu^{2+}$ materials may be used in optical structures, e.g. a glazing structures for a greenhouse, including glass panes coated with these materials.

In an embodiment, the glass pane may be highly transparent, diffused glass sheet having a high haze factor. In an embodiment, the diffused glass pane may have a light transmission of more than 90% and a haze factor higher than 70%. For example, the glass material may include optical scattering centers and/or textured surface(s) for scattering the light that passes the glass pane. This way, luminescent radiation generated by the $Eu^{2+}$ dopants and incoming solar radiation that passes the optical structure will be scattered in multiple directions thereby generating diffused light for optical crop growth.

Scattering of light may be achieved by patterning or texturing one or both sides of the glass pane. Hence, in an embodiment, at least one surface of the glass pane may include pattern and/or texture for scattering light in multiple directions.

In an embodiment, the $SiAlON:Eu^{2+}$ luminescent layer may be configured as a diffused coating for scattering the luminescent radiation and incoming solar radiation into multiple directions. In that case, the luminescent particle-based coating, wherein the particles are micron-sized $SiAlON:Eu^{2+}$ particles.

In an embodiment, the $SiAlON:Eu^{2+}$ luminescent material may be integrated within and/or part of a diffused coating.

In an embodiment, an anti-reflection (AR) structure may be provided over $SiAlON:Eu^{2+}$ luminescent material for optimal coupling of UV and solar light into the luminescent material.

In an embodiment, the AR structure may include two or more dielectric layers, wherein the thicknesses and the refractive indices of the dielectric layers may be selected to form an AR structure for coupling UV and PAR into the luminescent layer. In an embodiment, the AR structure may be provided over a luminescent coating on a transparent substrate and may be optimized for coupling UV and PAR into the luminescent layer.

In an embodiment, the luminescent layer may be provided over a glass pane having a refractive index of approx. 1.5. In another embodiment, instead of a glass pane a transparent polymer-based pane may be used.

In an embodiment, the $SiAlON:Eu^{2+}$ luminescent material may be synthesized as particles, e.g. nanoparticles. These particles may be (mono)dispersed in a binder material (an organic binder or an inorganic binder, e.g. $SiO_2$ or the like) and applied as a coating onto a transparent substrate. In an embodiment, the nano-sized particles may have an average particle size between 1 nm and 700 nm. The use of nano-sized particles may eliminate or at least minimize the light scattering that could reduce the efficiency of an LCL.

In a further aspect, the invention may relate to an optical structure comprising: a transparent substrate having a first surface, a second surface and sides; and, at least one luminescent layer provided over at least one of the first surface and/or second surface of the transparent substrate, the luminescent layer comprising an $Eu^{2+}$ doped inorganic luminescent material comprising or consisting essentially of the elements Al and/or Si and the elements O and/or N, the doped inorganic luminescent material converting radiation of the UV region between 200 nm and 400 nm of the solar spectrum into the photosynthetically active radiation (PAR) region (400 nm-700 nm) of the solar spectrum, wherein the nanoparticles comprise or consisting essentially of $Eu^{2+}$ doped SiAlON, the Si concentration being selected between 0 and 33 at. %, the Al concentration between 0 and 40 at. %, the O concentration between 50 and 66 at. %, the N concentration between 0 and 10 at. % and the $Eu^{2+}$ between 0.0001 and 5 at. %;

In an embodiment, the at least one transparent substrate may be an inorganic transparent substrate such as glass substrate or wherein the transparent substrate is a polymer-based transparent substrate.

In an embodiment, the at least one transparent substrate has a high haze factor, preferably the transparent substrate being a diffused transparent substrate having a high haze factor, the high haze factor being larger than 70%, preferably larger than 80%, more preferably larger than 90%; and/or, wherein the luminescent layer has a low haze factor, the low haze factor being smaller than 20%, preferably smaller than 10%, more preferably smaller than 2%.

In an embodiment, the at least one luminescent layer may comprise nanoparticles of the $Eu^{2+}$ doped inorganic luminescent material, preferably the nanoparticles having an average size between 1 nm and 700 nm, preferably between 2 nm and 500 nm, more preferably between 5 nm and 400 nm, yet more preferably 10 nm and 300 nm.

In an embodiment, the at least one luminescent layer is an amorphous or nanocrystalline layer.

In an embodiment, the transparent substrate may have a low haze factor, the low haze factor being smaller than 20%, preferably smaller than 10%, more preferably smaller than 2%; and/or, the at least one luminescent layer may have a high haze factor, the high haze factor being larger than 70%, preferably larger than 80% or more preferably larger than 90%.

In an embodiment, the luminescent layer may comprise $SiAlON:Eu^{2+}$ microparticles, preferably the microparticles having an average size between 0.7 and 200 micron, preferably between 0.8 and 100 micron, more preferably between 1 and 30 micron.

In an embodiment, the optical structure may further comprise an anti-reflection, AR, coating, preferably a multi-layer AR coating, for coupling light into the optical structure, preferably the AR coating being provided over the luminescent layer or the luminescent layer being part of the AR coating or embedded in the AR coating.

In an embodiment, the optical structure may be optically coupled to at least one photovoltaic cell, preferably optically coupled to one of the sides of the optical structure; In a further aspect, the invention may relate to a window assembly for a greenhouse comprising an optical structure according to any of the embodiments in this application.

In an embodiment, a high refractive index SiAlON:$Eu^{2+}$ luminescent material, e.g. a SiAlN:$Eu^{2+}$ luminescent material may be synthesized as particles, e.g. nanoparticles having average dimensions between 100 and 300 nm. These particles may be sparsely distributed over the surface of a transparent substrate of a low refractive index material, e.g. glass or the like. Here, sparsely distributed means that the average distance between particles is between 200 and 700 nm. Such sparsely distributed luminescent nanoparticles may form a broadband anti-reflection coating for light in the PAR region. Hence, the luminescent SiAlON:$Eu^{2+}$ material may form or be part of an anti-reflection structure or coating in various ways. For example, a luminescent SiAlON:$Eu^{2+}$ material composition including a relative large amount of Si (32>at. %) and $O_2$ (64>at. %) (corresponding to luminescent materials with a high LQE) can have a refractive index lower than 1.51 (glass) which makes it suitable as an anti-reflective coating. Alternatively, the luminescent SiAlON:$Eu^{2+}$ material may be incorporated in a multi-layer dielectric AR stack with alternating high and low refractive index SiAlON:$Eu^{2+}$ compositions. Further, it can be used by arranging nanoparticles between 200-700 nm of relatively high refractive index as a nano-particle coating onto a low-refractive index substrate (e.g. a glass substrate) so that the nano-particle coating forms plasmon resonant structures that have broadband anti-reflective properties.

In an embodiment, a refractive index-matched organic binder (such as PET, PE, PVB, PVA, PC, PP, PVP, Epoxy resin, Silicone, PS, PMA-derivatives, etc.) may be used as a transparent binder material for the nano-sized particles. A (mono)dispersed precursor of the coating may be applied onto a transparent (clear of diffused) substrate using a wet-coating technique such as spray coating, roll-to-roll coating, dip coating, doctor blade coating, brush coating, spin coating, etc.

In an embodiment, the SiAlON:$Eu^{2+}$ luminescent material may be synthesized as micron-sized particles. These particles may be (mono)dispersed in a binder material and applied as a coating on a transparent substrate. The micron-sized particles may have an average particle size between 0.7 and 16 μm in diameter. The particles may promote diffusion of the solar irradiation and the luminescent emission which is beneficial for plant growth. The diffusion of light can uniformly distribute incoming light that has advantages such as improved crop yield, higher leaf count, lower crop temperature and shorter crop time. This way, the luminescent micron-sized SiAlON:$Eu^{2+}$ particles may act both as a light conversion layer and a light diffusion layer (a light scattering layer).

In an embodiment, the nano-sized and micron-sized SiAlON:$Eu^{2+}$ particles can be dispersed as colloidal solution in solvents (a nanoparticle dispersion) such as water, hexane, toluene, ethanol, isopropanol, etc. and mixed proportionally with existing industrial agricultural coating precursors which already have anti-reflective, light diffusion, and/or light selective purposes. Compounding of light conversion and/or light diffusion effect can be achieved so.

In an embodiment, the nano-sized and micron-sized SiAlON:$Eu^{2+}$ particles can be dispersed in a transparent plastic film or sheet (such as PE, ETFE, PVC, PMMA, polycarbonate, etc.)

In an embodiment, the SiAlON:$Eu^{2+}$ luminescent nanoparticle may be synthesized based on a sol-gel synthesis process. The nanoparticles may be dispersed in a solvent contains precursors for elemental Si, Al, O and/or N, and $Eu^{2+}$ and polymeric additive. A nanoparticle dispersion synthesized based on such sol-gel process may be directly applied onto substrates by conventional wet-coating techniques. Different post-deposition treatments (varying temperature, ramping rates, reactive gas pressure, reactive gas compositions, reactive gas flow, etc.) can be applied to the coating for the desired optical, chemical, and mechanical performances. Traces of binder material precursors can also be included in the liquid precursor for different purposes such as controlling solution viscosity, increasing coating adhesion, minimizing coating porosity, altering coating surface morphology, etc.

The invention will be further illustrated with reference to the attached drawings, which schematically will show embodiments according to the invention. It will be understood that the invention is not in any way restricted to these specific embodiments.

DETAILED DESCRIPTION

In this disclosure, divalent Europium ($Eu^{2+}$) doped SiAlON luminescent nanoparticle materials are described that have superior and improved properties for greenhouse and crop growth applications. The improved properties include improved luminescent, optical and/or material properties when compared to luminescent materials for greenhouse applications known from the prior art.

It has been surprisingly found that certain SiAlON:$Eu^{2+}$ compositions exhibit UV absorbing PAR emitting $Eu^{2+}$ doped SiAlON material wherein the absorption and emission spectra exhibit no or almost no overlap. In particular, it has been found that luminescent $Eu^{2+}$ doped SiAlON materials absorb a substantial part of the UV band of the solar spectrum and convert radiation in this band to radiation of a longer wavelength, in particular radiation in the photosynthetically active radiation (PAR) region. The SiAlON host material exhibits superior properties in terms of mechanical strength, chemical inertness and thermal resistance and is for that reason used in protection and anti-reflection coatings in the glass industry. The $Eu^{2+}$ doped SiAlON material forms a very stable conversion material which has optical properties at are compatible with glazing structures for greenhouses. The nanoparticle materials, their advantages and their uses in luminescent coatings for greenhouses and luminescent sheet structures for greenhouses are described hereunder in more detail with reference to the figures.

Figure 1A:
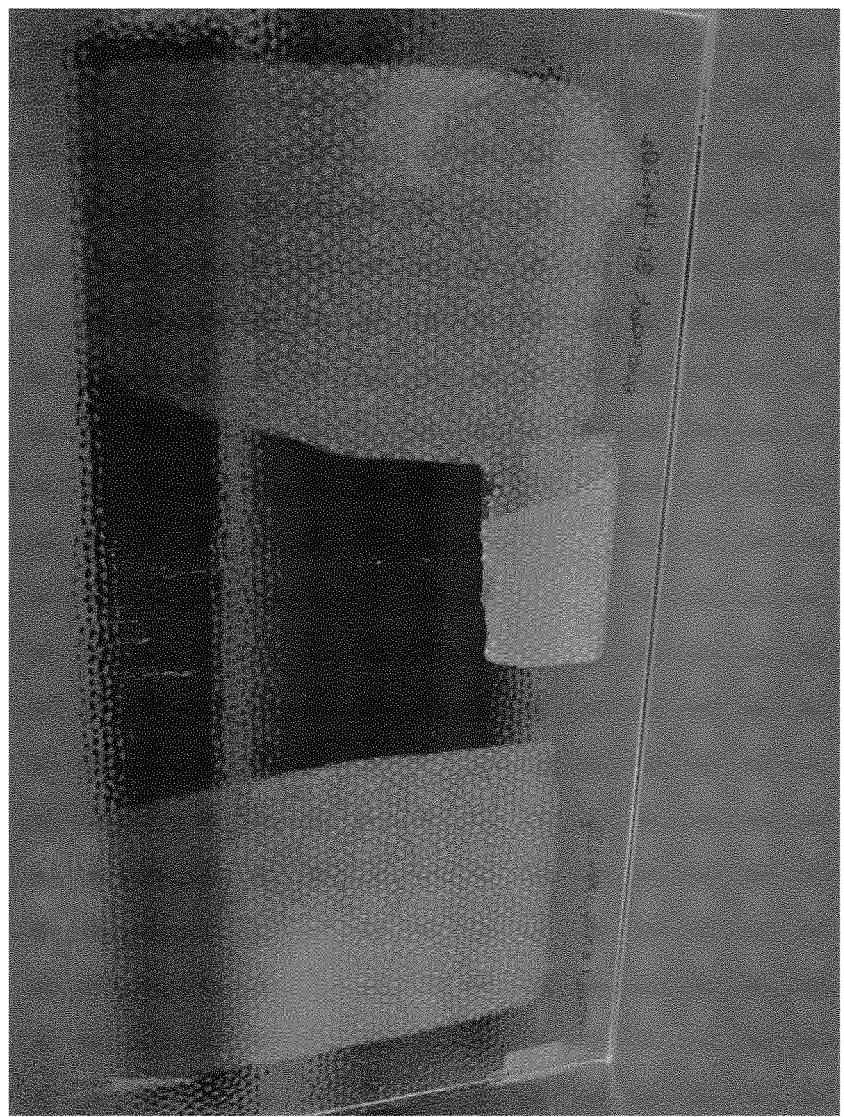
FIGS. 1A and 1B depict a photograph and an IQE graph of a luminescent nanoparticle coating according to an embodiment of the invention.
Figure 1B:
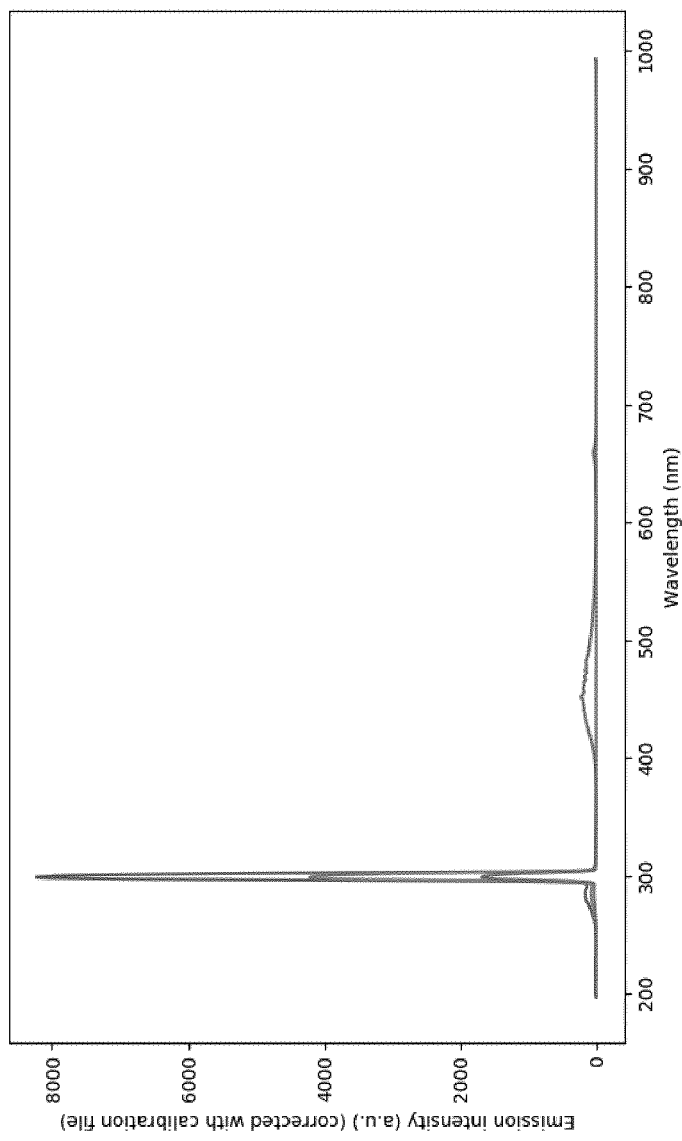

FIG. 1A depicts a photograph of a structured glass pane coated with a nano-particle SiAlON:$Eu^{2+}$ coating which is illuminated by UV light. The photograph was taken under illumination by broad band UV light causing the nano-particle SiAlON:$Eu^{2+}$ coating to emit radiation in the PAR region, i.e. between 400 and 700 nm. A dispersion of $Eu^{2+}$ doped SiAlON nano-particles was made by dispersing 3.5 wt. % nanoparticles in uncured acrylic polymer matrix at a pH 11. Prior to the coating step, the glass pane was cleaned with 36% wt. hydrochloric acid, ethanol, DI water with sonication. The coating was thermally treated at 150° C. with 30 minutes. FIG. 1B depicts an internal quantum efficiently (IQE) graph of the nanoparticle coating showing very high quantum efficiencies. A BaSO4 was used as a reference by assuming it reflects uniformly in the UV-VIS light. This reference is then used how much light (incl sample holder) was being absorbed. Then the absorptance and the IQE can be determined, wherein the IQE is measured based on the so-called "DeMello method.

Figure 2:
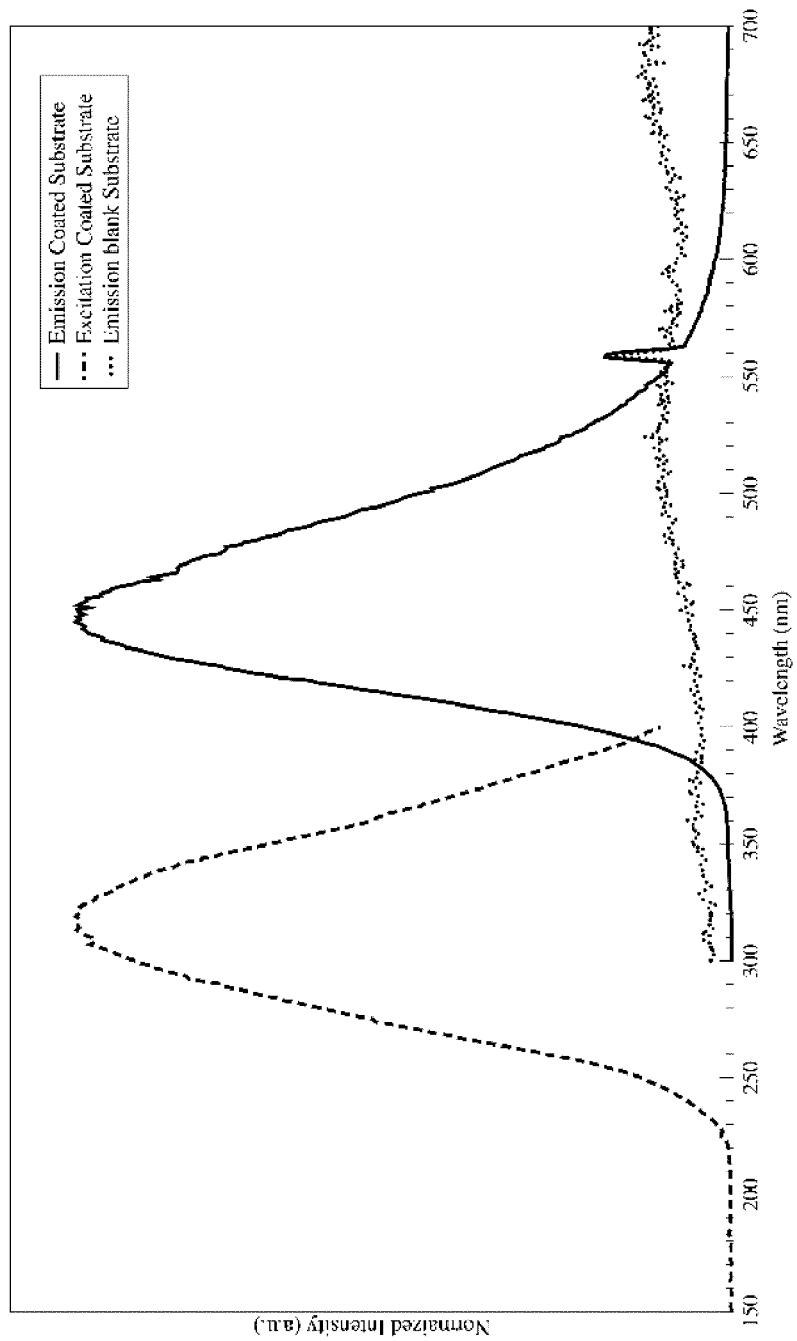
FIG. 2 depict excitation and emission spectra luminescent nanoparticle coating according to an embodiment of the invention.

FIG. 2 depicts the excitation and emission spectra of the particle-based coating as shown in FIG. 1A. As shown in the figure the spectra exhibit no or almost no overlap not overlap and show excellent UV abortion centered at 320 nm and PAR emission centered at 450 nm. The nanoparticles were synthesized using exemplary synthesis steps of a sol-gel technique as described below. The composition of the particles was $Si_{1.92}Al_{0.08}O_{1.08}N_{1.92}$ including a doping concentration of 1 mol % $Eu^{2+}$. In this embodiment, the nanoparticles may have an average particle size (average diameter) between 100 and 300 nm. The size distribution of the nanoparticles may be determined based on scanning electron microscopy (SEM) picture or a dynamic light scatting (DLS) measurement which is well known in the art.

Figure 3:
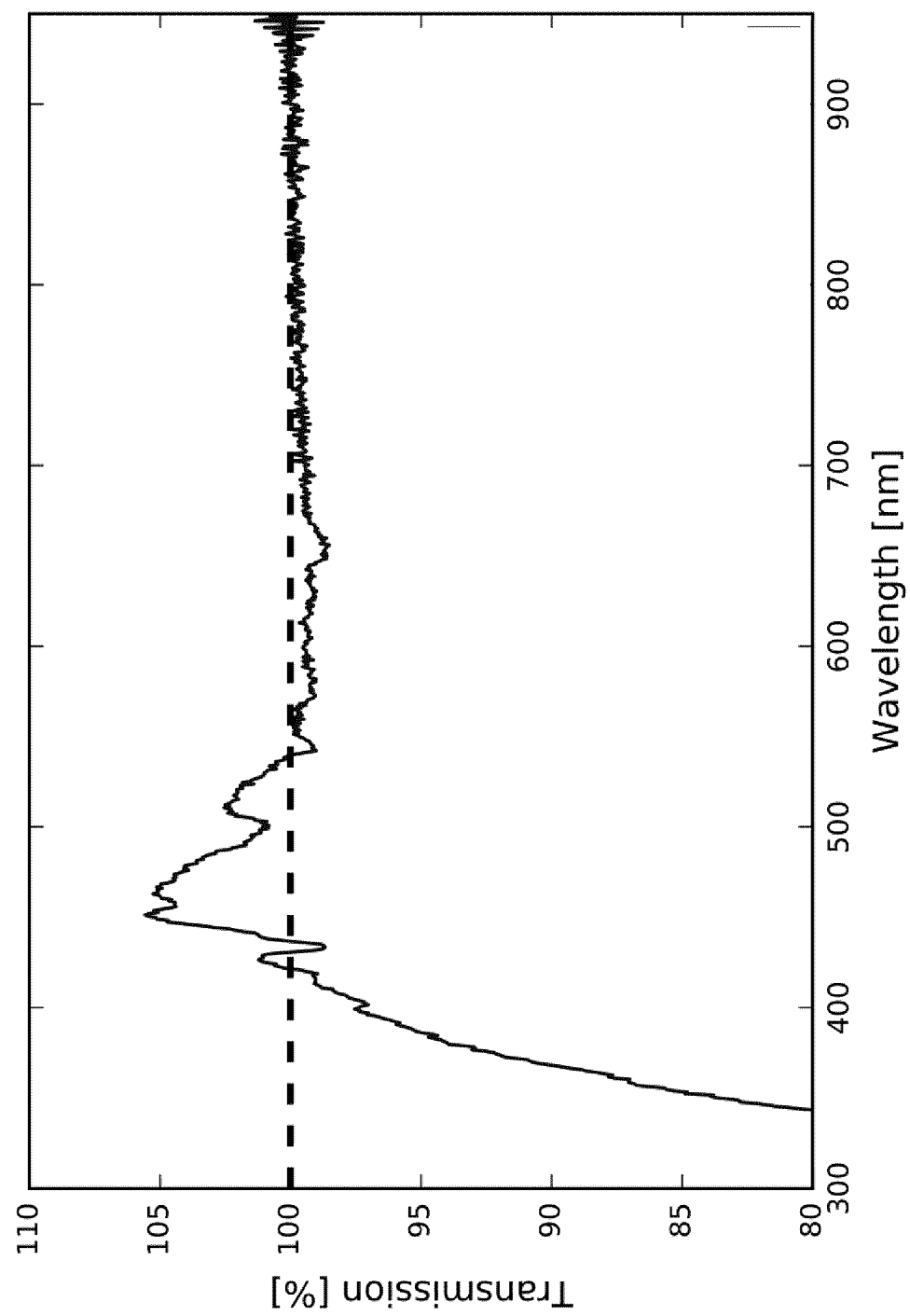
FIG. 3 depicts the transmission of a luminescent coated sample according to an embodiment of the invention illuminated by solar radiation.

The SiAlON:$Eu^{2+}$ nanoparticle coatings described with reference to the embodiments of this application exhibit excellent conversion characteristics. FIG. 3 represents a graph of the transmission of a coated SiAlO:$Eu^{2+}$ sample showing >100% transmission in the PAR region, in this example in the range between (approx.) 440 and 520 nm, and a strong reduction in the transmission for wavelength smaller than 400 nm.

The SiAlON:$Eu^{2+}$ luminescent particles may be synthesized based on a wet-chemical process such as a sol-gel synthesis method using different precursors for the elements Si, Al, O, N, and Eu. Different post-deposition treatments, e.g. thermal annealing, can be applied to material for the desired optical, chemical, and mechanical performances.

The SiAlON:$Eu^{2+}$ particles may be synthesized using a sol-gel method including compounds such Tetraethylorthosilicate (TEOS) with formula $Si(OC_2H_5)_4$, $Al(NO_3)_3$ and Europium salts. Optionally, ethanol and/or citric acid may be added to assist the formation of nanoparticles. Nitridation can be promoted by a nitrogen-filled sintering environment. Polymeric coating and/or lamination can be made by dispersing the nanoparticles in a matrix material. Choices and optimization of such matrix polymer can be made based on their applications and conditions. Epoxy resins, polymethylmethacrylate) (PMMA), and polysiloxane) are some common materials that can incorporate these nanoparticles.

In an embodiment, a sol-gel synthesis method may be used to produce a SiAlON:$Eu^{2+}$ nanopowder material may include the steps of:
stoichiometrically weighting TEOS and Al, N, O and Eu precursors: 7.7447 g $Si(OC_2H_5)_4$, 0.3299 g $Al(NO_3)_3$, 0.0681 g $Eu_2O_3$;
dissolving the europium oxide $Eu_2O_3$ in minimal amount of diluted nitric acid;
dissolving the aluminum nitrate ($Al(NO_3)_3$) in ethanol and placing it on a heating plate;
dissolving TEOS ($Si(OC_2H_5)_4$) in ethanol and placing it on a heating plate;
mixing the TEOS solution with $Al(NO_3)_3$ solution and $Eu_2O_3$ solution to form a mixture of a colloidal solution (sol);
evaporating the mixture on the heating plate to form ~20 ml of sol;
aging the sol for 72 hours at 60° C. in the dryer to form a gel structure;
calcinating the gel at 500° C. in air to remove any residual organic content;
sintering at 1100° C. under a reducing atmosphere;
grinding the product in an agate mortar to form particles, for example nano-sized particles or micron-sized particles.

In another embodiment, a sol-gel synthesis method for producing SiAlO(N):Eu2+ particles may include the steps of:
Stoichiometrically weigh TEOS and Al, N, O and Eu precursors: 7.7447 g $Si(OC_2H_5)_4$; (TEOS), 0.3299 g $Al(NO_3)_3 \cdot 9H_2O$, and 0.1274 g $Eu(C_2H_3O_2)_3$ (Eu (Ace));
Dissolve Eu(Ace) in DI water to form a first colloidal solution (sol 1);
Dissolve $Al(NO_3)_3 \cdot 9H_2O$ in 6 g of ethanol to form a second colloidal solution (sol 2); pre-heat the solution at 60° C. for 15 min;
Dissolve TEOS in 3.4253 g of ethanol to form a third colloidal solution (sol 3) (EtOH:TEOS≈2:1 molar ratio); pre-heat the mixture at 60° C. for 15 min;
Mix sol 1 and sol 2 to form a fourth colloidal solution (sol 4);
Dropwise add sol 3 to sol 4;
Evaporate the mixture on a heating plate to form ~20 ml of sol;
Age the sol for 24 hours at 60° C. in an oven to form a gel structure;
Grind the product using a mortar and pestle to form a white SiAlO(N):Eu2+ powder;
Calcinate at 500° C. for 5 hours in air to remove any residual organic content with a heating rate of 3° C./min; naturally cool the product;
Grind the product after calcination;
Sinter at 1100° C. for 3 hours under a reducing atmosphere (7%$H_2$/93%$N_2$) with a heating rate of 3° C./min; naturally cool the product;
Grind the product to form the nanophosphor.

The process described above allows 2 grams nanoparticles, wherein the composition of the nanoparticles $Si_{1.92}Al_{0.08}O_{3.96}$:1mol % Eu, with a Si/Al ratio of 24, and Eu doping concentration of 1% resulting in a composition Si: 32.0 at. %, Al: 1 at. %, O2 66 at. % and Eu: 1 at. %. Based on the above syntheses methods, SiAlON:Eu$^2$ different nanoparticle materials may be produced. The SiAlON:Eu$^{2+}$ nanoparticle materials may be realized with the Si concentration being selected between 0 and 33 at. %, the Al concentration between 0 and 40 at. %, the O concentration between 50 and 66 at. %, the N concentration between 0 and 10 at. % and the Eu$^{2+}$ between 0.0001 and 5 at. %.

In an embodiment, nanoparticles of the SiAlON:Eu$^{2+}$ material may be synthesized wherein the average particle size may be selected between 1 and 500 nm in diameter. In another embodiment, the average particle size may be selected between 2 and 400 nm in diameter. In a further embodiment, the average particle size may be selected between 5 and 100 nm in diameter. The nano-sized particles may provide advantageous optical properties to a nanoparticle coating, for example it may eliminate or at least minimize the light scattering that could reduce the efficiency of such luminescent coating.

The SiAlON:Eu$^{2+}$ nanoparticles may be (mono)dispersed in a transparent polymeric binder medium to form a nanoparticle dispersion. A nanoparticle dispersion may be realized by dispersing nanoparticles in a carrying medium (which may be referred to in short as a binder or medium), applying the nanoparticle dispersion as a coating onto a transparent substrate, such as a glazing structure or a polymer sheet, and drying the nanoparticle coating to form a polymer nanoparticle coating on the substrate. The coating may be formed using known coating techniques such as spray coating. To form a nanoparticle dispersion, the surface of the nanoparticles may be modified using a surface modification process.

In an embodiment, the surface of nanoparticles may be modified by sonication (i.e. applying ultrasound wave energy with frequencies >20 KHz to the particles) in different types of ligands. Examples of such ligands may include stearic acid, oleic acid, octanoic acid, oleylamine, octylamine, octanthiol and trioctylphosphine. Alternatively, in an embodiment, the surface of nanoparticles may be modified by chemical bonds formation such as silanization, esterification, or similar processes. Such chemical bond formation processes may be used to attached long organic side chain(s), with a carbon chain length between 8 and 18, to the surface of the nanoparticles. The surface modifications of the nanoparticles based on a ligand and/or chemical bond formation may allow nanoparticles to easily disperse in the carrying mediums so that nucleation of the particles can be prevented.

Based on the above-mentioned particle treatments, a nanoparticle dispersion may be formed. The weight percentage wt % of the nanoparticles in the nanoparticle dispersion may be selected between 1% and 80 wt %, preferably between 5 and 50 wt %, more preferably between 15 wt % and 35 wt %.

In an embodiment, the (modified) nanoparticles may be dispersed in organic solvents between 1% to 80%, more preferably 5% to 50%, more preferably 15% to 35%. In some embodiments, the (modified) nanoparticles may be dispersed in organic solvents between 25±10%. Organic solvents may include hexane, ethanol, heptane, toluene, chloroform, dichloromethane between. The solvent may further include between 0.5% and 10% polymer dispersants. Examples of such polymeric dispersants may include PP, PE, PVP, PMA-derivatives, PS, PU, etc.

In another embodiment, the (modified) nanoparticles may be dispersed in an aqueous solvent, such as alkali aqueous solution, including an ammonium solution and a sodium hydroxide solution. The aqueous solvent may further include 1% to 10% waterborne polymeric dispersants, including polyacrylates, polyurethanes, copolymers etc. (PP, PE, PVP, PMA-derivatives, PS, PU, etc.).

In an embodiment, the polymeric dispersants and binders are acrylic acid-, urathane-, acylate-, epoxy-. based polymeric dispersants or binders respectively.

In further embodiments, a dispersion may be formed on the basis of polymeric binders as described in WO2018/169404, which is hereby incorporated by reference into this application.

The polymeric dispersants may act as dispersants to disperse the nanoparticles and will cross-link during drying to form a polymeric nanoparticle coating. Polymeric dispersants enhanced the long-term stabilization of the nanoparticles in a medium by combining steric hindrance of solubilizing side chains and electrostatic repulsion of charges on anchoring groups. Additionally, the polymeric dispersant allows a controlled polymerization process to provide a high-quality nanoparticle coating layer.

In an embodiment, a refractive index-matched organic binder (such as PET, PE, PVB, PVA, PC, PP, PVP, Epoxy resin, Silicone, PS, PMA-derivatives, etc.) may be used to form a nanoparticle dispersion.

A (mono)dispersed nanoparticle coating may be formed by applying a nanoparticle dispersion onto a transparent (clear of diffused) substrate, e.g. a glass pane or a transparent polymer sheet, using a wet-coating technique such as spray coating, roll-to-roll coating, dip coating, doctor blade coating, brush coating, etc. This way, high-quality substantially scatter-free or low-scattering SiAlON:Eu$^{2+}$ luminescent nanoparticle coatings may be realized in an efficient and cheap way. Based on the above-mentioned wet-coating techniques, nanoparticle coatings with a thickness between 10 and 200 micrometer, preferably between 20 and 180 micrometer, more preferably between 50 and 150 micron can be realized.

In an embodiment, the SiAlON:Eu$^{2+}$ luminescent material may be synthesized as micron-sized particles. The micron-sized particles may be (mono)dispersed in a binder material and applied as a coating on a transparent substrate in a similar way as described above with reference to the nano-sized particles. In an embodiment, the micron-sized particles may have an average particle size selected between 0.5 μm and 15 μm in diameter. The particles may promote diffusion of the solar irradiation and the luminescent emission which is beneficial for plant growth. The diffusion of light can uniformly distribute incoming light that has advantages such as improved crop yield, higher leaf count, lower crop temperature and shorter crop time. This way, the luminescent micron-sized SiAlON:Eu$^{2+}$ particles may act both as a light conversion layer and a light diffusion layer.

The luminescent particle-based materials described with reference to the embodiments in this application may be used in glazing structures and transparent sheet structures for greenhouses and buildings for indoor farming. Exemplary advantageous optical structures are described hereunder with reference to FIG. 4-7.

Figure 4:
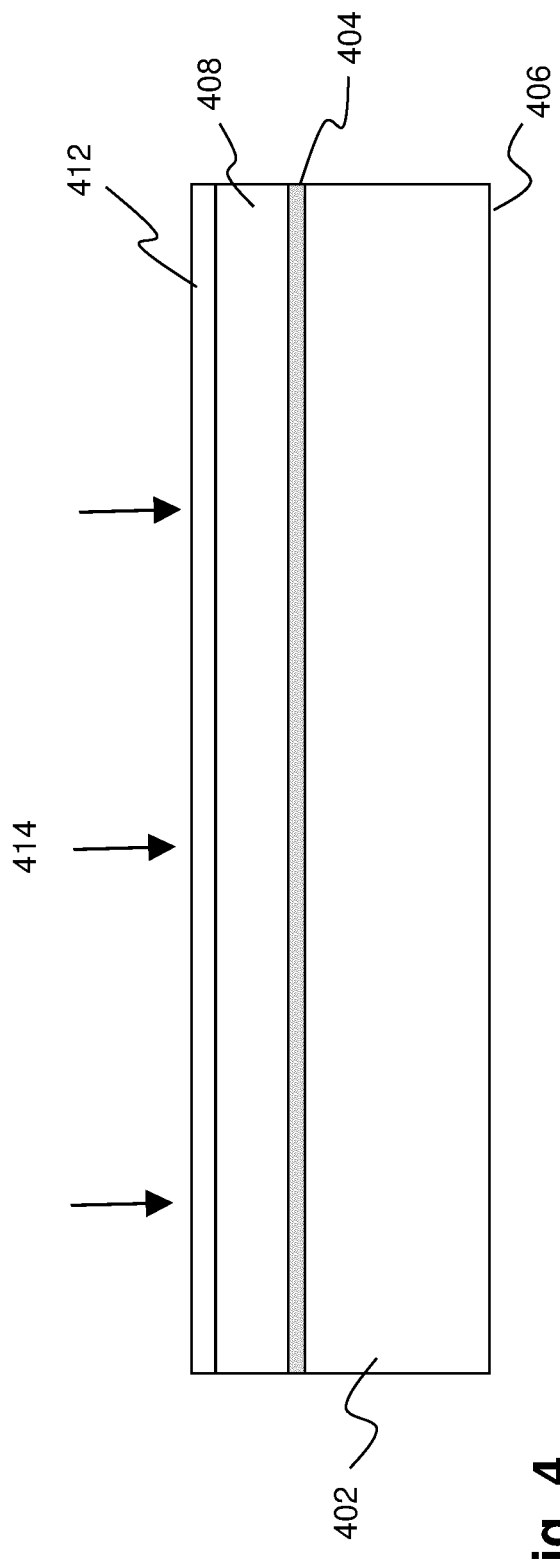
FIG. 4 depicts a luminescent nanoparticle coating according to an embodiment of the invention.

FIG. 4 depicts a glazing structure comprising a luminescent particle-based coating according to an embodiment of the invention. As shown in the figure, the optical structure may include a transparent glass pane or transparent polymer sheet 402 having a first surface 404 and second surface 406, wherein the first surface may be configured to receive external solar light 410 and the second surface may be configured to couple light 414 out of the glazing structure into the greenhouse. The glazing structure or the polymer sheet may be part of or used in a greenhouse. In case of a glazing structure, the length of the glazing may be selected between 300 and 100 cm, preferably 250 and 140 cm, more preferably 220 and 160 cm and the width of the glazing may be selected between 200 and 40, preferably 180 and 50, more preferably between 160 and 60 cm. Typical dimensions (length×width) may include: 2.140×1.122, 1.650×1.22, 1.650×997 and 1.650×730 mm. Further, a glazing may have a thickness between 6 and 3 mm, preferably 5.5 and 3.5 mm, more preferably 5.0 and 3.5 mm.

The SiAlON:Eu$^2$ nanoparticle coating may be applied by spray-coating a nanoparticle dispersion as described above on the first surface of the substrate, e.g. a glazing. A further coating 412 without nanoparticles may be applied using a wet-coating process over the luminescent nanoparticle coating for protection. Typically, the composition of the protective coating may be identical or similar to the polymeric binder material of the nanoparticle coating.

In an embodiment, the surface of the glazing may be subjected to a surface treatment to introduce a light scattering top surface. The surface scattering interface may be introduced to maximize light coupling out of the second (bottom) surface of the glazing. The surface treatment may include an etching step resulting in a textured surface.

The etching process may be a wet etching process or a dry etching process. The wet etching process works by dissolving parts of the surface by immersing it in a chemical solution. In an embodiment, a mask may be used to selectively etch the material. A dry etching process may be based on sputtering or dissolution of the material at. This may be achieved by a reactive ion etching step or ion beams. The resulting surface characteristics (and therefore scattering properties) can be tuned by adjusting various etching parameters (e.g. plasma feed gas, reactive gas types and flows, gas pressure, etch time etc.) and measuring the scattering properties of the textured surface. The textured surface may have a regular (period) pattern or it may have a random pattern.

The texture patterns may have features (diameters and heights) in the nanometer to micrometer range. Texture features fabricated on the basis of a mask-based etching process may include cones, pyramids, microlenses in nanometer range (approx. 10 nm up to 1000 nm) or features in the micrometer range, e.g. 1 micrometer up to 500 micrometer. Alternatively, texture features fabricated on the basis of a mask-les etching process, may result in substantially random texture features with dimensions in the nanometer range or micrometer range.

A measure for the surface roughness of the surface interface is the standard deviation of the Gaussian scattering distribution of light scattered at the surface interface.

Such measurements are well known in the art, e.g. Kurita et al, *Optical surface roughness measurement from scattered light approximated by two-dimensional Gaussian function*, Transactions on Engineering Sciences vol. 2, 1993. This article may hereby incorporated by reference in this disclosure.

In another embodiment, possible backscattering effects by the nanoparticles may be reduced using SiO2 porous nanoparticles. In an embodiment, the porous nanoparticles may be added to the luminescent nanoparticles. In an embodiment, 0.1-5 wt % porous nanoparticles may be added to the luminescent nanoparticles. In further embodiments, 0.5 to 2.0 wt % may be added to the luminescent nanoparticles. In another embodiment, the typically, the porous nanoparticles may have the same or a similar size or size distribution as the luminescent nanoparticles. The porous nanoparticles will provide the coating antireflective properties. The SiO2 porous nanoparticles will reduce the refractive index of the coating layer relative to the substrate thereby substantially reducing back-scattering and increasing coupling light via the second surface out of the substrate. A luminescent layer may be deposited (e.g. coated or sputtered) directly onto the surface of the substrate. Alternatively, before depositing a luminescent layer onto the substrate one or more layers, e.g. adhesion layers, buffer layers and/or passivation layers may be deposited over the substrate.

In a further embodiment, instead of a coating over a substrate, the nano-sized and micron-sized SiAlON:Eu$^{2+}$ particles can be dispersed in a transparent polymer (such as PE, ETFE, PVC, PMMA, polycarbonate, etc.) that is shaped as a transparent plastic film or sheet which can be used in a greenhouse. Typically, the thickness of such sheet may be between 1 and 1000 micrometer, preferably 10 and 500 mm, more preferably 40 and 120 micrometer. Further, between 1 and 80 wt %, preferably 5 and 50 wt %, more preferably 15 and 35 wt %, of luminescent nanoparticles may be dispersed in the film.

Figure 5:
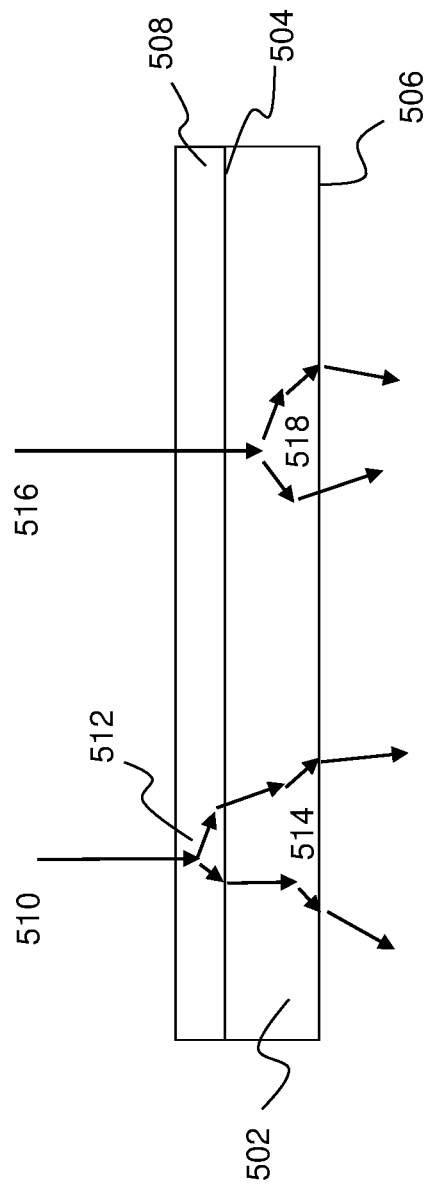
FIG. 5 depicts a transparent sheet structure comprising a luminescent nanoparticle coating according to various embodiments of the invention.

In the embodiment of FIG. 5, the optical structure may comprise a substantially scattering free or low-scattering SiAlON:Eu$^{2+}$ nanoparticle coating 508 and high-scattering transparent substrate 502 (also referred to as a diffused transparent substrate). Such layer may include SiAlON:Eu$^{2+}$ nanoparticles in an inorganic or organic matrix material. In an embodiment, the matrix material may be an amorphous dielectric material such as SiAlON, $Si_3N_4$, $Al_2O_3$, $Ti_2O_3$, etc. In another embodiment, the matrix material may be a transparent organic dielectric material such as PMMA, polyacrylic acid, polycarbonate, polyethylene, fiberglass. Such nanoparticle coating may be realized based on suitable particle synthesis methods and coating techniques as described in this application.

The substrate 502 may include a diffused transparent substrate. For example, in an embodiment, the substrate may be a diffused glass substrate. The diffusive glass material may be optimized for light transmission (in particular light transmission in the PAR region), while scattering the light in random directions when the light leaves the substrate. In an embodiment, the diffused glass substrate may comprise scattering structures for scattering the light in a diffusive way. Instead of a glass substrate, a (diffused) transparent polymer-based substrate may be used, wherein the substrate is provided with light scattering structures so that diffusive light leaves optical structure on the second surface.

The optical structure depicted in FIG. 5 will receive radiation of the solar spectrum ranging from UV to IR radiation. UV light will be transformed by the divalent Eu dopants 512 in the SiAlON nanoparticles into radiation of the PAR. The PAR light generated by the Eu$^{2+}$ doping sites 514 and the PAR light from the solar light 518 will exit the optical structure as diffused light, which is advantageous for plant growth.

Figure 6:
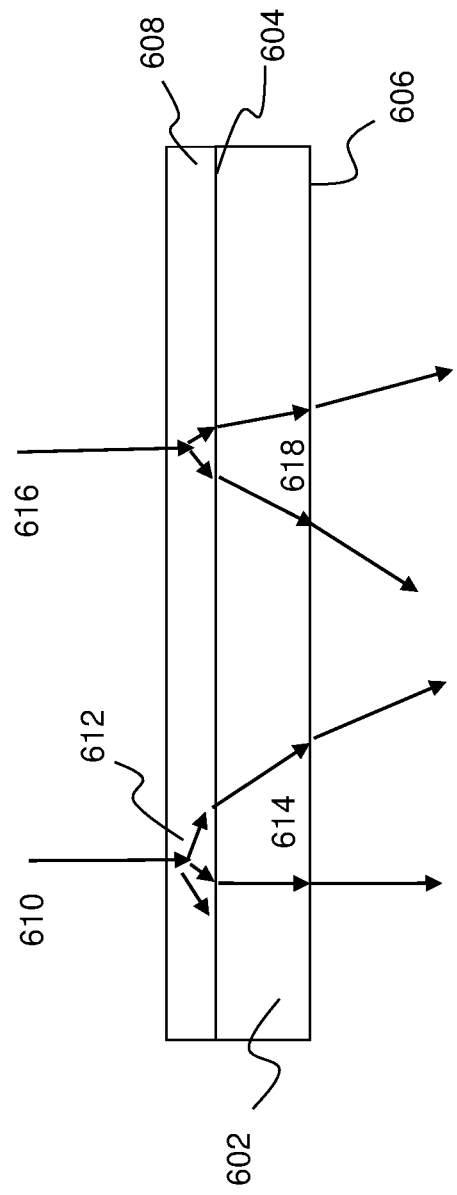
FIG. 6 depicts a transparent sheet structure comprising luminescent nanoparticle coating according to various embodiments of the invention.

In the embodiment of FIG. 6, the optical structure may comprise a high-scattering luminescent thin-film layer 608 and low-scattering transparent substrate 602. In an embodiment, the luminescent thin-film layer may be a thin-film polycrystalline SiAlON:Eu$^{2+}$ provided over a low-scattering transparent substrate, e.g. a glass substrate or a transparent polymer based substrate. In another embodiment, instead of a thin-film polycrystalline SiAlON:Eu$^{2+}$ as high-scattering micro-particle based coating layer may be used. Such layer may include SiAlON:Eu$^{2+}$ micron-sized particles in an inorganic or organic matrix material. In an embodiment, the matrix material may be an amorphous dielectric material such as SiAlON, $Si_3N_4$, $Al_2O_3$, $Ti_2O_3$, etc. In another embodiment, the matrix material may be a transparent organic dielectric material such as PMMA, polyacrylic acid, polycarbonate, polyethylene, fiberglass. Such micron-particle coating may be realized based on suitable particle synthesis methods and coating techniques as described in this application.

The optical structure depicted in FIG. 6 will receive radiation of the solar spectrum ranging from UV to IR radiation, wherein UV light will be transformed by the divalent Eu dopants 612 in the SiAlON layer into radiation of the PAR. As the SiAlON layer is a high-scattering layer, the PAR light emitted by the $Eu^{2+}$ doped material will be scattered into the low-scattering transparent substrate. Further, the doped SiAlON layer will act as a scattering layer for the visible part, including the PAR region. Hence, this part of the solar light will be scattered into the diffused substrate. The PAR light generated by the $Eu^{2+}$ doping sites 614 and the PAR light from the solar light 618 will exit the optical structure as diffused light, which is advantageous for plant growth.

It is submitted that the invention is not limited to the optical structures as described with reference to FIG. 4-6. For example, in a further embodiment, the optical structure may include a high-scattering luminescent thin-film layer as well as a high-scattering transparent substrate. Hence, both the luminescent layer and the substrate are configured to generate diffusive light that leaves the optical structure. In such embodiment, the optical structure may be optimized for transmitting and generating highly diffused light in the PAR region when the optical structure is exposed to solar radiation.

Further, in an embodiment, instead of providing one or more luminescent layers over the first surface (or in addition to providing one or more luminescent layers over a the first surface), a low-scattering or low-scattering luminescent layer may be provided over the second surface of the transparent substrate, which—deepening on the application—may either be a high-scattering (diffused) substrate or a low-scattering substrate.

Figure 7A:
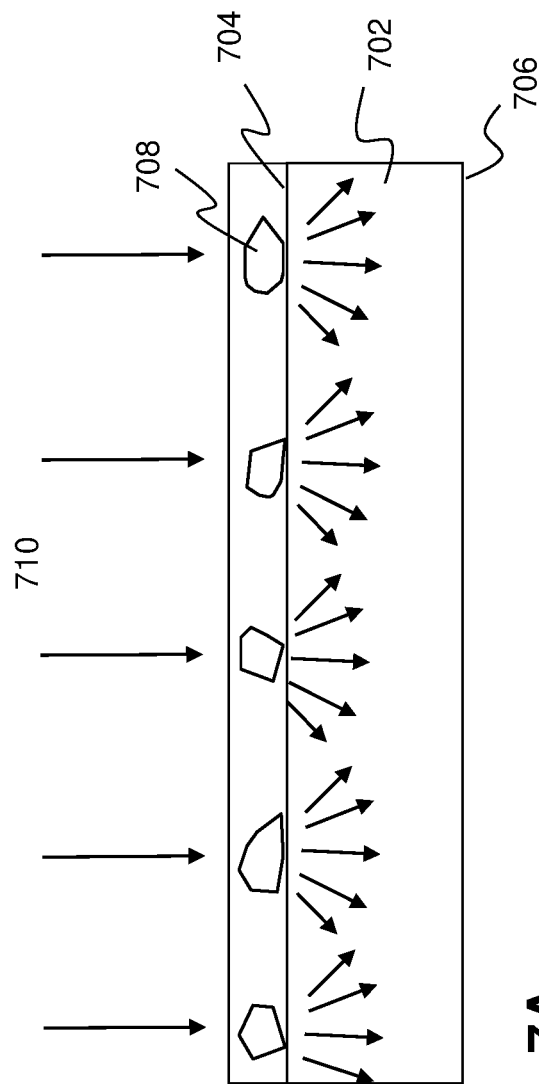
FIGS. 7A and 7B depict a transparent sheet structure comprising luminescent particle-based anti-reflection coating according to an embodiment of the invention.
Figure 7B:
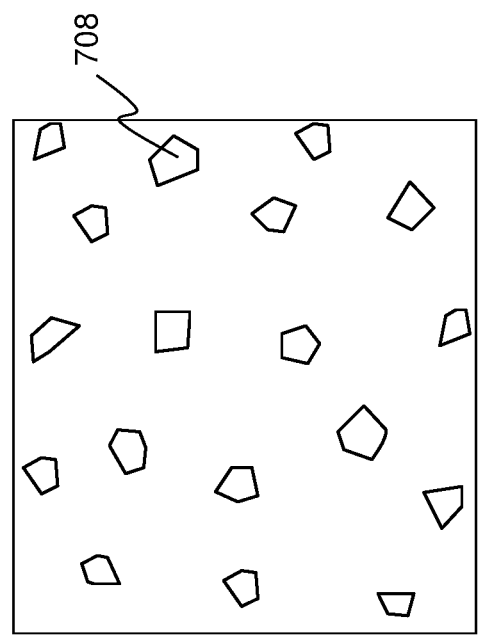

FIG. 7A and 7B depict an optical structure according to yet another embodiment. In this embodiment, luminescent nanoparticles 708 having average dimensions between 100 and 300 nm are parsley distributed over a first (top) surface 704 of a transparent substrate 702. Here, sparsely distributed means that the average distance between particles is between 200 and 700 nm. The luminescent particles may be luminescent SiAlON:$Eu^{2+}$ based nano-particles having a relatively high refractive index. For example, in an embodiment, the particle material may include AlN doped with a few at. % of $Si^{4+}$, $O^{2+}$ and $Eu^{2+}$ ions, in particular 5% of lower, so that the refractive index of the luminescent material is approximately 2.14 to form a luminescent anti-reflection coating according to an embodiment of the invention.

It is known from US2013/0194669 that a layer of high-refractive index nanoparticles which are sparsely distributed over a surface of a low-refractive index material, e.g. glass substrate, may function as a broadband antireflection coating. Here, the nanoparticles may be arranged in an ordered array or alternatively the nanoparticles may be randomly distributed over the surface of the transparent substrate. The antireflective properties of such nanoparticle layer may be attributed to the formation of plasmonic modes when solar light 710 interacts with nanoparticles having dimensions in the range 200 and 700 nm. These plasmonic modes will cause the light to be effectively scattered into the substrate as shown in the figure. The luminescent nanoparticle AR layer will both convert UV light of the solar spectrum in to PAR light and acts as an efficient broadband antireflection layer for the rest of the solar spectrum, in particular the visible part of the solar spectrum.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope of the appending claims and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A dispersion of luminescent nanoparticles for coating a greenhouse glazing structure, said dispersion comprising:
    an organic or aqueous medium; and
    luminescent nanoparticles,
    wherein the nanoparticles comprise $Eu^{2+}$ doped SiAlON and the $Eu^{2+}$ doped SiAlON comprising a Si concentration from 30 at. % to 33 at. %, an Al concentration from 0.01 at. % to 2 at. %, an O concentration from 50 at. % to 66 at. %, an N concentration from 0.1 at. % to 1 at. % and an $Eu^{2+}$ concentration from 0.0005 at. % to 1 at. %.

2. The dispersion according to claim 1, wherein the nanoparticles have an average particle size from 1 nm to 1000 nm.

3. The dispersion according to claim 1, wherein the dispersion comprises from 1 wt. % to 80 wt. % of the nanoparticles.

4. The dispersion according to claim 1, wherein the dispersion comprises the organic medium and the organic medium comprises an organic solvent and from 0.5 wt. % to 10 wt. % of polymer additives.

5. The dispersion according to claim 1, wherein the dispersion comprises the aqueous medium and the aqueous medium comprises an alkali aqueous solution and from 1 wt. % to 10 wt. % of water-borne polymer additives.

6. The dispersion according to claim 1, wherein a surface of the nanoparticles is modified based on one or more types of ligands of the nanoparticles and the modification includes sonication of the nanoparticles.

7. The dispersion according to claim 1, wherein a surface of the nanoparticles is modified by formation of chemical bonds for coupling the nanoparticles to one or more long organic side chains having a carbon chain length of between 8 and 18 carbon atoms.

8. The dispersion according to claim 1, wherein the dispersion further comprises inorganic porous nanoparticles.

9. A transparent plastic sheet for a greenhouse, said plastic sheet comprising:
a transparent polymeric material; and
$Eu^{2+}$ doped inorganic luminescent nanoparticles dispersed in the polymeric material,
wherein the nanoparticles comprise $Eu^{2+}$ doped SiAlON and the $Eu^{2+}$ doped SiAlON has comprising a Si concentration between from 30 at. % to 33 at. % 0 at. % and 33 at. %, an Al concentration from 0.01 at. % to 2 at. %, an O concentration from 50 at. % to 66 at. %, an N concentration from 0.1 at. % to 1 at. % and an $Eu^{2+}$ concentration from 0.0005 at. % to 1 at. %.

10. The transparent plastic sheet according to claim 9, wherein a thickness of the sheet is from 1 micrometer to 1000 micrometers.

11. A luminescent glazing structure for a greenhouse comprising:
a glazing structure;
a coating provided over at least part of a surface of the glazing structure, the coating comprising a transparent polymeric material and $Eu^{2+}$ doped inorganic luminescent nanoparticles dispersed in the polymeric material,
wherein the nanoparticles comprise $Eu^{2+}$ doped SiAlON and the $Eu^{2+}$ doped SiAlON comprising a Si concentration from 30 at. % to 33 at. %, an Al concentration from 0.01 at. % to 2 at. %, an O concentration from 50 at. % to 66 at. %, an N concentration from 0.1 at. % to 1 at. % and an $Eu^{2+}$ concentration from 0.0005 at. % to 1 at. %.

12. The luminescent glazing structure according to claim 11, wherein a thickness of the coating is from 10 micrometers to 200 micrometers.

13. A greenhouse comprising the luminescent glazing structure according to claim 11.

14. The dispersion as claimed in claim 1, said dispersion consisting essentially of:
an organic or aqueous medium; and
luminescent nanoparticles,
wherein the nanoparticles comprise $Eu^{2+}$ doped SiAlON and the $Eu^{2+}$ doped SiAlON has a Si concentration from 30 at. % to 33 at. %, an Al concentration from 0.01 at. % to 2 at. %, an O concentration from 50 at. % to 66 at. %, an N concentration from 0.1 at. % to 1 at. % and an $Eu^{2+}$ concentration from 0.0005 at. % to 1 at. %.

15. The dispersion according to claim 2, wherein the nanoparticles have an average particle size from 20 nm and to 600 nm.

16. The dispersion according to claim 3, wherein the dispersion comprises from 15 wt. % to 35 wt. % of the nanoparticles.

* * * * *